United States Patent [19]

Karash et al.

[11] Patent Number: 4,931,742

[45] Date of Patent: Jun. 5, 1990

[54] SELF-PROTECTING POWER BUS TESTING SYSTEM

[75] Inventors: Karl Karash, Lowell; Steen Bentzen, Berlin, both of Mass.

[73] Assignee: GenRad, Inc., Concord, Mass.

[21] Appl. No.: 326,966

[22] Filed: Mar. 22, 1989

[51] Int. Cl.$^5$ ............................................ G01R 31/02
[52] U.S. Cl. .................................................. 324/541
[58] Field of Search ................ 324/539, 541, 544, 66, 324/540; 361/59

[56] References Cited

U.S. PATENT DOCUMENTS

| | | | |
|---|---|---|---|
| 3,922,537 | 11/1975 | Jackson | 324/73 R |
| 4,224,690 | 9/1980 | Rockwell | 324/540 |
| 4,282,479 | 8/1981 | Deboo et al. | 324/539 |
| 4,384,249 | 5/1983 | Medina | 324/66 |
| 4,689,551 | 8/1987 | Ryan et al. | 324/539 |
| 4,713,653 | 12/1987 | McDermott | 324/133 |

Primary Examiner—Reinhard J. Eisenzopf
Assistant Examiner—Maura K. Regan
Attorney, Agent, or Firm—Nutter, McClennen & Fish

[57] ABSTRACT

To avoid component damage due to the presence of an incorrect voltage on the power bus of an electrical system when the system's power supply is turned on, the system carries out a self-testing procedure before power up to detect fault-indicating low impedance paths in the power bus. For this, the system includes a test power supply which delivers to the bus during the self-testing routine test voltages which are much lower than those supplied to the bus by the main supply. In accordance with the self-testing routine, the main power supply is turned on upon completion of the routine only if no low impedance paths are detected in the bus. As the supply voltages are applied to the bus, they are compared with preselected limits. If any voltage is not within its limits, the system provides an indication to that effect and/or shuts down the system.

7 Claims, 2 Drawing Sheets

SELF-PROTECTING POWER BUS TESTING SYSTEM

This invention relates to testers. It relates more particularly to a power bus testing system which has a self-protection capability.

Test instruments are used to monitor the status and behavior of circuits in computer and other electronic systems. Some circuit testers are incorporated into a larger electronic system; other testers are separate stand-alone instruments. The present invention has application to both types of test equipment, and, indeed, it can be incorporated into other electronic circuits and systems of more general application.

Electronic testers invariably include a power supply which delivers to a power bus a variety of positive and negative dc voltages necessary for the proper operation of the various electrical components comprising the tester. These components are often mounted on printed circuit cards, each card being provided with a set of printed pads or terminals usually located at an edge of the card. The cards are arranged to be plugged into a set of sockets mounted side-by-side to the face of a printed circuit board which constitutes a backplane. The power bus comprises a set of conductors on the backplane which receive the different voltages from the power supply. Other conductors on the backplane interconnect the various cards.

When powering up a testing or other system, it is often desirable to monitor the voltages provided by the system's power supply to ensure that those voltages have proper values initially and during normal operation of the system. This is particularly important in the case of a tester used to evaluate electrical components and printed circuit boards. Obviously, if the voltages which power and bias the components of a tester are incorrect, the test indication provided by that tester may be faulty.

One convenient way to measure and monitor such supply voltages is to incorporate a programmable voltmeter into the tester. voltage limits may be programmed into the voltmeter and the meter operated to sample the voltages on the different conductors of the power bus on power up and periodically during operation of the tester. If the voltage on a particular bus conductor is not within the limits established for that conductor, the system can be arranged to signal the operator of that fact and/or to shut down.

It has been found, however, that when some testing. systems are powered up in order to take measurements of the voltages on the power bus to verify that they are correct, circuit components can be damaged due to the application of an incorrect voltage to one or another component of the system due to a fault in the power bus or in the connections between the bus and the printed circuit cards coupled to the bus. For example, printed circuit paths on the backplane can be bridged by solder debris or adjacent contacts in the connectors or sockets to which the pc cards are coupled can be bent into conductive engagement. If an incorrect voltage should be applied to a critical electrical component, the ensuing failure of that component can cause progressive failure of other components thereby resulting in considerable damage to the overall system.

SUMMARY OF THE INVENTION

Accordingly the present invention aims to provide an electrical system having a self-testing capability which avoids damage to the system due to the test.

Another object is to provide a self-protecting power bus testing system which minimizes the likelihood of progressive damage to the system's electrical components during power up and during normal operation due to the presence of incorrect voltages on the power bus.

Another object of the invention is to provide a system of this type which tests for low impedance paths on the system's power bus and then monitors the system during power up to insure that the voltages on the power bus conform to specifications.

A further object of the invention is to provide such a system which is relatively easy and inexpensive to implement.

Other objects will, in part, be obvious and will, in part, appear hereinafter. The invention accordingly comprises the features of construction, combination of elements and arrangement of parts which will be exemplified in the following detailed description, and the scope of the invention will be indicated in the claims.

Briefly, my system monitors the output voltages from the power supply of a circuit tester or other electrical apparatus to ensure that those voltages remain within the correct limits. As such, the system includes means for measuring those voltages. The voltage measuring means can be programmed and controlled by the same central processor that controls other parts of the tester or other apparatus.

To avoid component damage due to the presence of an incorrect voltage on the power bus when the power supply is turned on, the system carries out a self-testing procedure before power up to detect fault-indicating low impedance paths in the power bus. More particularly, the system includes a test or "bootstrap" power supply which, like the main power supply, is connected to the system's power bus. The test power supply delivers to the power bus the same number of positive and negative dc voltages supplied by the main power supply, but those voltages are much lower than the voltages applied to the bus by the main supply. Furthermore, the test supply does not deliver enough current to damage the bus lines or the pc cards or other electrical components connected to the bus.

The system also includes an ac power controller which controls the application of ac power to the central processor, the voltage measuring means and the test power supply at certain points in the self-testing procedure and to the main power supply upon the successful conclusion of that procedure, i.e. if no faults are detected.

To begin the self-testing procedure, a switch in the power controller is turned on to supply ac power to the central processor, the voltage measuring means and to a switch that delivers power to the test power supply. Upon receiving ac power, the processor carries out a standard bootstrap routine. If that routine is not completed successfully, a power-up failure is logged and the self-testing procedure ends. On the other hand, if the boot procedure is successful, the central processor closes a second switch in the power controller which allows the processor to control other parts of the system, including the voltage sensing means. Thereupon, the processor loads selected voltage limits into the voltmeter. These limits are typically voltage ranges within which the voltages on the power bus from the test power supply should fall if there are no short circuits, low impedance paths or other circuit defects in the power bus.

The central processor then directs the voltage sensing means to take measurements of the voltages on the different conductors or lines of the power bus. At this point in the self-testing procedure, both the test power supply and the main power supply are turned off so that there should be no current flow on the power bus, i.e. zero volts. If the voltages on the power bus are outside the zero limit, this indicates a fault in the system. Upon detecting such an abnormal condition, the voltage sensing means issue a fault signal to the central processor which thereupon logs a power-up failure and shuts the system down and the self-testing procedure ends.

On the other hand, if the power bus voltage measurements are all within the zero limit, the central processor closes the switch delivering ac power to the test power supply so that the voltages from the test power supply are applied to the various conductors of the power bus. As mentioned previously, these voltages are small percentages of the voltages and currents normally applied to the corresponding bus conductors by the main power supply. The central processor thereupon directs the voltage sensing means to take another series of voltage measurements on the various lines of the bus and those measured voltages are compared with the desired voltage limits previously programmed into the measuring means. If the voltage on one of the bus lines is not within its allowed limits, the voltage sensing means issues as fault signal to the central processor which logs a power-up failure and turns off the test power supply and the self-testing routine ends. If, however, all of the voltages on the power bus are within their prescribed limits, the central processor closes a switch in the power controller that delivers ac power to the main dc power supply. Resultantly, the full dc voltages are applied to the various lines of the power bus and are distributed to all of the pc cards and components connected to that bus.

After the test power supply is turned off, selected limits for the voltages from the main power supply can be loaded into the voltage measuring means so that on power up, as the outputs from the main supply are applied to the power bus, these voltages can be measured. If any one is not within its assigned limits, the measuring means will issue a fault signal to the processor prompting the processor to shut down the main power supply and thus the overall system and/or to flag the operator. Likewise, the system can be arranged to monitor the bus voltages during normal operation of the system to assure that they remain within their limits.

If the system successfully completes the aforesaid self-testing procedure prior to power up, there is little likelihood of there being a short circuit or other circuit fault in the system that could result in damage to circuit components due to the application of incorrect voltages thereto after the system is powered up. Thus the self-protecting power bus testing system disclosed herein should greatly reduce the incidence of progressive failure of components in systems of this type, resulting in considerable reduction in system downtime and repair costs. Yet the system, being composed of conventional electrical components which are relatively easy and inexpensive to incorporate into circuit board testers and other electrical apparatus of this general type, should not materially increase the overall costs of such apparatus.

BRIEF DESCRIPTION OF THE DRAWINGS

For a fuller understanding of the nature and objects of the invention, refer to the following detailed description, taken in connection with the accompanying drawings, in which.

DESCRIPTION OF THE PREFERRED EMBODIMENT

Figure 1:
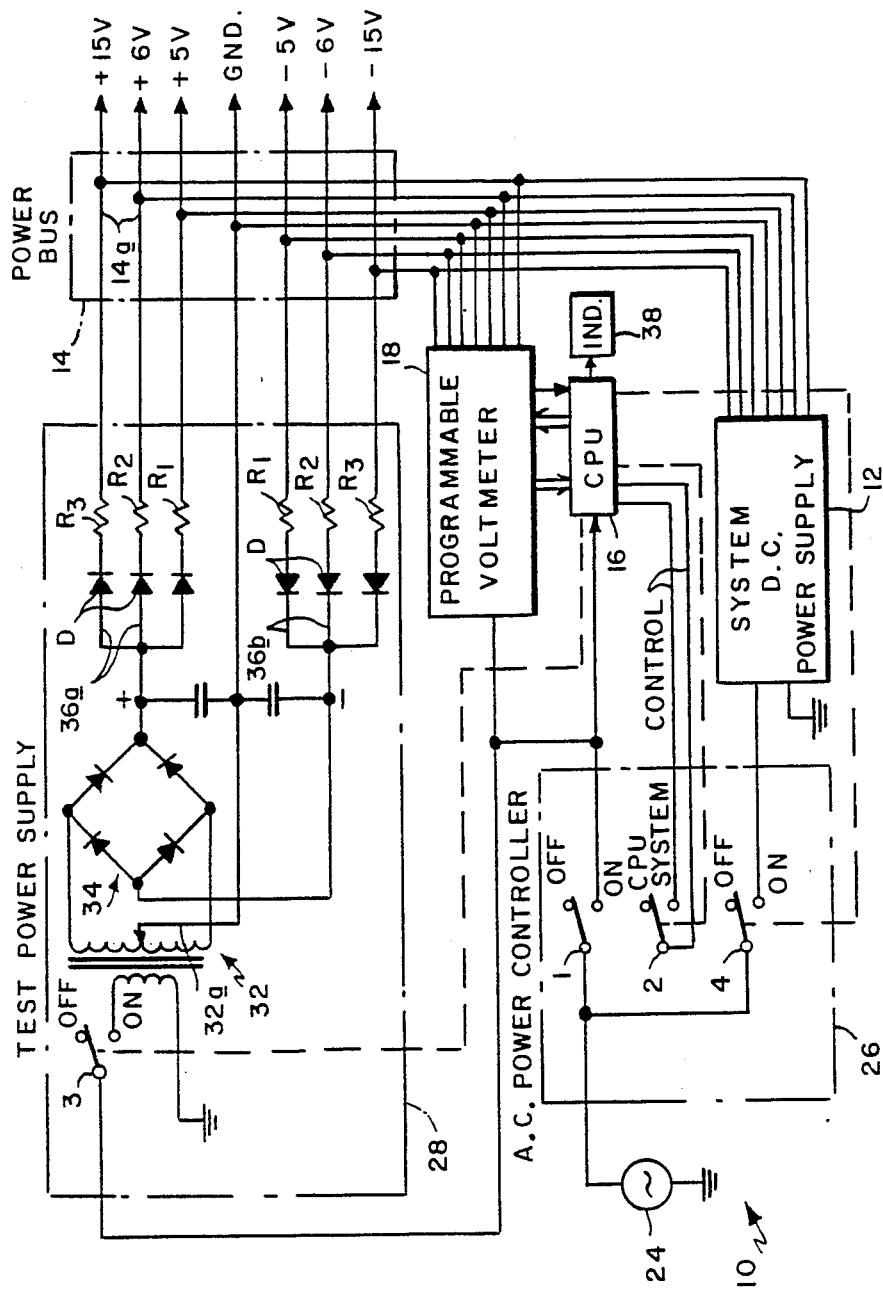
FIG. 1 is a schematic diagram showing a self-protecting power bus testing system incorporating this invention.

Refer now to FIG. 1 of the drawings which shows the power supply section 10 of electrical apparatus, in this instance, a printed circuit card testing system. This section 10 includes a main dc power supply 12 which provides a plurality of different dc voltages to a power bus 14. In the illustrated example, bus 14 has seven lines or conductors 14a, one of which is electrical ground and the others of which normally carry different voltages, for example plus or minus five, six and fifteen volts. Typically, the power bus is on a printed circuit board constituting a backplane. The various electrical circuits and components comprising the test system are carried on printed circuit cards and these cards are plugged on-edge into sockets mounted side-by-side to the backplane. Appropriate electrical connections are made between the various lines on the bus and the socket contacts so that the power supply voltages are distributed to the pc cards as needed to operate the system.

The power supply section 10 also includes a central processor unit (CPU) 16 which is usually the processor that controls the operation of the test system as a whole. Also included are voltage measuring means, such as a programmable voltmeter 18, controlled by the processor and arranged to take measurements of the voltages on the various power bus lines 14a. Accordingly, conductors extend from bus lines 14a to the voltmeter which includes internal switching to enable the sampling of those lines one after the other and a comparator to enable the comparing of those voltages with selected voltage limits programmed into the voltmeter. Voltage measuring instruments of this type are quite conventional and need not be detailed here.

An ac power source 24 delivers power to the power supply section 10 by way of an ac power controller 26. The controller is basically a set of switches. More particularly, controller 26 includes a two-position switch 1 which is connected between source 24 and processor 16 as well as voltmeter 18 to deliver power to those units when the switch is in its closed or ON position. There is also a two-position switch 2 in the controller which is connected between conductors leading to control terminals in the central processor 16. When switch 2 is in its open or CPU position, processor 16 can only perform its customary boot routine; it cannot carry out its other functions ancillary to the operation of the tester generally. When switch 2 is in its closed or SYSTEM position, processor 16 can perform all of these other functions. The operation of switch 2 is under the control of processor 16 as will be described. Power controller 26 also includes a two-position switch 4 connected between source 24 and the main power supply 12. When switch 4 is in its open or OFF position, no power is supplied to supply 12 and, therefore, no current should appear on power bus 14. When switch 4 is in its closed or ON position, supply 12 delivers the specified different voltages to the different lines 14a of bus 14. The operation of switch 4 is also under the control of processor 16 as will be described later.

Also included in power supply section 10 is a test or "bootstrap" power supply 28 having a separate output connected to each line 14a of power bus 14. Thus in the illustrated system, supply 28 has seven conductors leading to the seven lines 14a of the power bus. The test supply 28 includes a transformer 32 whose primary winding circuit includes a two-position switch 3 connected to the ON terminal of the switch 1 in power controller 26. When switch 3 is in its open or OFF position, no power is supplied to transformer 32; when that switch is in its closed or ON position, transformer 32 is energized provided that switch 1 in power controller is in its ON position.

A conventional diode bridge rectifier 34 is connected across the secondary winding of transformer 32. The rectifier 34 provides positive and negative dc voltages relative to electrical ground which appears on a conductor 34a leading from the center tap of the transformer secondary winding to the ground conductor of the power bus 14. The positive side of the bridge circuit is connected to three current limiting circuits 36a leading to the three lines 14a of bus 14 that normally carry positive voltages from the power supply 12. Likewise, the negative side of the bridge circuit is connected by way of three similar current limiting circuits 36b to the three bus lines 14a that normally carry the negative voltages delivered by power supply 12. The usual filter capacitors are provided between the ground conductor and the positive and negative sides of the bridge circuit 34.

Each current limiting circuit 36a, 36b includes a diode D for isolation protection and a series resistor $R_1$, $R_2$ or $R_3$. The resistors $R_1$, $R_2$ and $R_3$ are valued so that when the test supply 28 is turned on, selected voltages are applied to the bus 14 which are small fractions of the voltages applied to the bus by the main power supply 12 during normal operation of the test system. For example, the voltages provided by supply 28 might be only 10% of those supplied by power supply 12, i.e. plus or minus 0.5, 0.6 and 1.5 volts, respectively. Also, the electrical current in the lines from power supply 28 are much lower than the current supplied by the main power supply 12. Whereas supply 12 may deliver the indicated voltages to the bus at 100 amps., the power supply 28 may supply only 1 amp. In any event, it should be understood that the voltages supplied by the test power supply 28 are sufficiently low so as not to damage bus 14 and the components connected thereto. Furthermore, that test supply will not deliver enough current to the bus to damage the bus lines 14a or the pc cards or other electrical components connected to the bus even if there should be a short circuit or other such fault in the bus.

Figure 2:
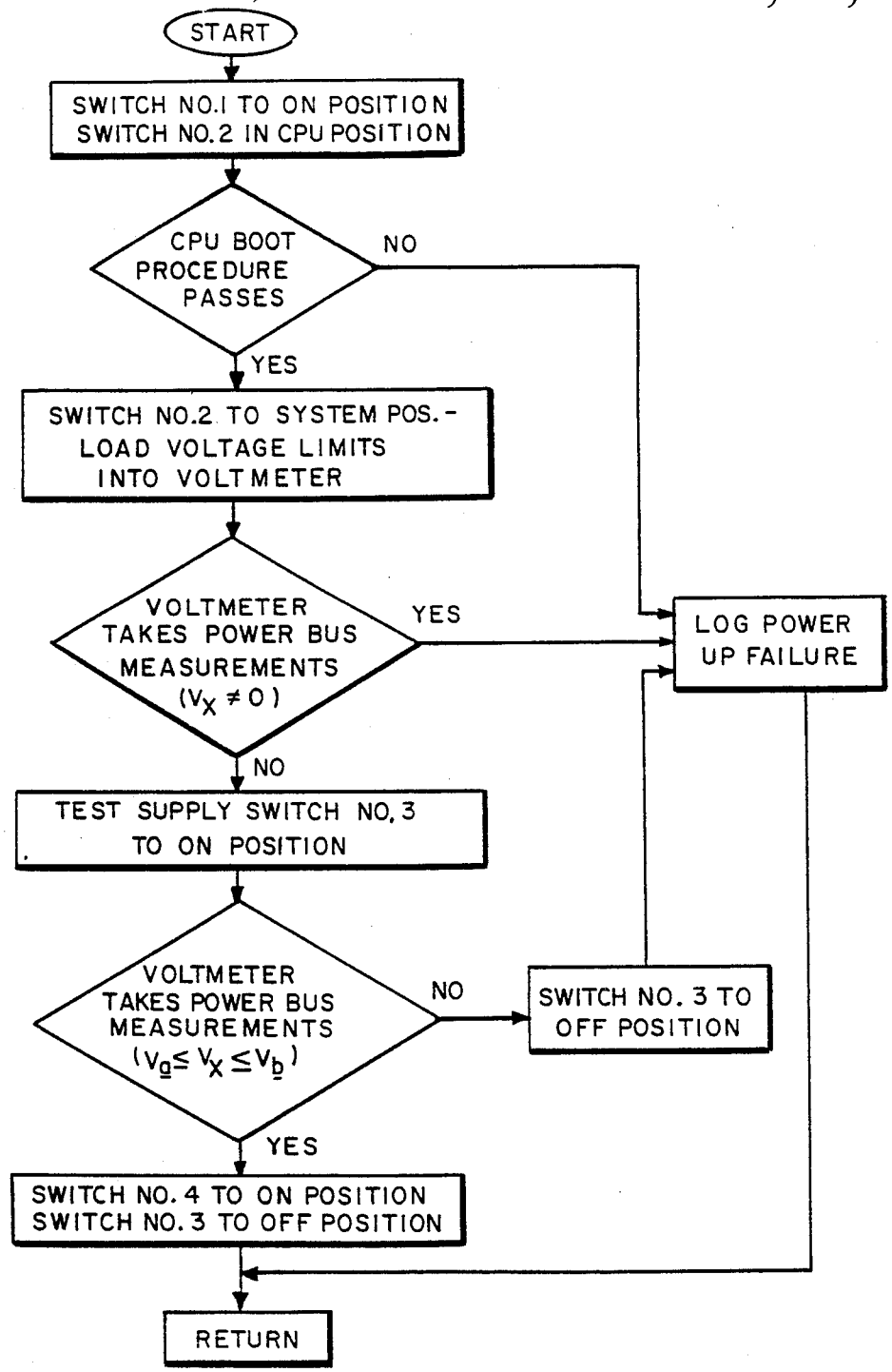
FIG. 2 is a flow chart illustrating the operation of the FIG. 1 system.

When the power supply section 10 and the test system as a whole are shut down, all of the switches 1, 2, 3 and 4 are in their open positions as shown in FIG. 1. In accordance with this invention, before the test system is powered up and, more particularly, before the main power supply 12 is turned on, a self-testing procedure is carried out by the power supply section 10 in accordance with the routine shown in FIG. 2. This routine is initiated by closing switch 1, usually manually. The closing of that switch supplies power to the central processor 16, voltmeter 18 and to the switch 3 in the test power supply 28. At this point, switch 2 is in its open or CPU position so that the processor can operate its booting routine, but is unable to control the overall test system.

If the boot procedure is not successful, processor 16 logs a power-up failure and may be arranged to shut down the system by opening switch 1 and/or to signal the failure by activating an indicator 38. In any event, the failure marks the completion of the self-testing routine which may then be repeated to re-boot the processor 16. If, on the other hand, the boot procedure is successful, the processor 16 issues a signal which closes switch 2 so that the processor can perform its other control functions required for the operation of the test system as a whole. Thereupon, the processor loads selected voltage limits into voltmeter 16. These limits do not apply to the voltages to be supplied by the main power supply 12 when the system is operating normally, rather they are voltage limits appropriate for the much lower voltages supplied to bus 14 by the test power supply 28 for carrying out the self-testing procedure prior to turning on the overall system. In a typical system, these voltage limits may be, for example, the applied voltage plus or minus 0.1 volt.

As soon as the voltage limits are loaded into voltmeter 18, the voltmeter takes measurements of the voltages on the various lines 14a of bus 14 and compares each measured voltage with the voltage limits for that line programmed into the meter. It should be remembered that at this point in the self-testing procedure, the switch 3 in test supply 28 which supplies power to the transformer 32 is open as is also the switch 4 in controller 26 which supplies power to the main power supply 12. Therefore, there should be no current flow on power bus 14. Accordingly, voltmeter 18 should register within the zero voltage limit on each of the lines 14a of bus 12. If the meter does detect current flow on one or more of those lines, this indicates a failure in the power supply section 10, e.g. a defective switch 3. On the other hand, if section 10 passes this voltage test, i.e. no current flow on bus 14, processor 16 closes switch 3 so that power is applied to transformer 32 resulting in the test voltages being applied to bus 14.

Next, processor 16 directs voltmeter 18 to take measurements of the voltages applied to bus 14 by the test power supply 28 and to compare those voltages with the voltage limits previously loaded into the voltmeter. If the voltage on any one of the bus lines 14a is not within its assigned limits, the voltmeter issues a fault signal to processor 16 which thereupon logs a power-up failure and opens switch 3 to turn off the test power supply 28, ending the self-testing routine. The processor may also signal that failure on indicator 38. An incorrect test voltage on one of bus lines 14a can be caused, for example, by a low impedance on the bus line due to a short circuit or other fault. As noted previously, the voltages and current from the power supply 28 are much lower than the voltages and current provided by the main power supply 12. Therefore, there is little likelihood of damage to the power bus or the electrical components connected thereto due to the supply 28 outputs to the bus even if there should be a fault in the bus.

If, on the other hand, all of the voltages on the bus lines 14a are within their respective limits, processor 16 opens switch 3 thereby shutting down the test power supply 28 and then closes switch 4 thereby turning on the main power supply 12. Supply 12 now delivers to bus 14 all of the different voltages required to operate the overall system.

After the self-testing procedure just described, selected voltage limits for the outputs from the main power supply 12 may be loaded into voltmeter 18 so that as the main supply voltages are applied to bus 14, the voltmeter 18 will measure those voltages as they come on line. If all of the voltages are not within their respective limits, the voltmeter will issue a fault signal to processor 16 causing the processor to signal the failure on indicator 38 and/or shut down the system by opening switch 4 in power controller 26.

During normal operation of the testing apparatus, section 10 can be arranged to interrogate the bus lines 14a from time to time to monitor the voltages on the bus 14. If at any time the voltmeter 18 detects that the voltage on a line 14a is above or below its assigned limit, voltmeter 18 will send a fault signal to processor 16 causing the processor to open switch 4 in controller 26 thereby shutting down the entire system. Alternatively, the controller may simply apprise the operator of a potential problem by activating indicator 38.

The inclusion of the controller 28 and test power supply 28 in a system which already includes a central processor and means for monitoring voltages does not appreciably increase the overall complexity or cost of the system. Yet when all of these units are combined and operated as described herein, there is much less likelihood of damage to the power bus or components connected thereto due to incorrect voltages being applied to the bus during power up because of an existing fault in the bus.

It will thus be seen that the objects set forth above, among those made apparent from the preceding description, are efficiently attained. Since certain changes may be made in the above construction without departing from the scope of the invention, it is intended that all matter contained in the above description or shown in the accompanying drawings shall be interpreted as illustrative and not in a limiting sense.

It should also be understood that the following claims are intended to cover all of the generic and specific features of the invention herein described.

What is claimed as new and desired to be secured by Letters Patent of the United States is:

1. An electrical system of the type that includes a power bus having a plurality of different conductive lines and a power supply for delivering a plurality of different supply voltages simultaneously to the different lines of the bus when the supply is turned on, the improvement comprising means for applying a plurality of different test voltages simultaneously to said bus before the power supply is turned on, the test voltage applied to each line of the bus being a relatively small fraction of the supply voltage applied to that same line;

detecting means coupled to said bus for detecting low impedance paths in the bus upon application of the test voltages to the bus, said detecting means including means for comparing the voltages applied to the different lines of the bus by the test applying means with preselected test voltage limits and producing a said first output if all of the voltages on the lines are within their assigned limits and a said second output if all of the voltages on the lines are not within their assigned limits, and switch means responsive to said first output for interrupting the test voltage to the bus and turning on said power supply.

2. The electrical system defined in claim 1 and further including indicating means responsive to said second output for providing an indication that not all of the voltages on the bus lines are within their assigned limits.

3. The electrical system defined in claim 1 wherein the comparing means include a programmable voltmeter, and means for programming the voltmeter with said test voltage limits.

4. The electrical system defined in claim 3 wherein the programming means include a processor unit.

5. The electrical system defined in claim 1 wherein said detecting means include means for detecting voltages on the bus lines prior to the application of the test voltages to the bus, said detecting means producing a said first output if the voltage on each bus line is within the zero limits and a second said output if the voltage on each bus line is not within said zero limits.

6. The electrical system defined in claim 5 and further including comparing means for substituting, prior to the production of a said first output, preselected supply voltage limits for the preselected test voltage limits so that after said power supply is turned on, the comparing means produces a said second output if the voltages on all of the bus lines do not remain within their assigned preselected limits.

7. The electrical system defined in claim 6 wherein said system comprises a printed circuit board tester.

* * * * *